United States Patent
Kangas

(10) Patent No.: US 8,231,396 B2
(45) Date of Patent: Jul. 31, 2012

(54) PLUG-IN-UNIT ASSEMBLY WITH AN OFF-CENTER PIVOTAL CONNECTION BETWEEN A HANDLE AND AN ACTUATING MEMBER

(75) Inventor: Simo Kangas, Vaasa (FI)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/110,363

(22) Filed: May 18, 2011

(65) Prior Publication Data

US 2011/0287650 A1    Nov. 24, 2011

(30) Foreign Application Priority Data

May 19, 2010    (EP) .................................... 10163244

(51) Int. Cl.
*H01R 13/62* (2006.01)
*H05K 7/16* (2006.01)

(52) U.S. Cl. ........................ 439/172; 361/727

(58) Field of Classification Search .................. 439/157, 439/372, 483, 310; 361/727, 801
See application file for complete search history.

(56) References Cited

U.S. PATENT DOCUMENTS

| | | | |
|---|---|---|---|
| 5,791,753 A * | 8/1998 | Paquin | 312/332.1 |
| 6,137,684 A | 10/2000 | Ayd et al. | |
| 6,222,736 B1 * | 4/2001 | Sim et al. | 361/727 |
| 6,816,367 B2 * | 11/2004 | Liu et al. | 361/679.33 |
| 7,175,470 B2 | 2/2007 | Kangas | |
| 7,535,717 B2 * | 5/2009 | Lai et al. | 361/727 |
| 7,586,748 B2 * | 9/2009 | Chen | 361/727 |
| 7,771,218 B2 * | 8/2010 | Jaramillo et al. | 439/157 |
| 8,040,687 B2 * | 10/2011 | Pirillis | 361/801 |
| 2009/0080165 A1 | 3/2009 | Barina et al. | |

* cited by examiner

*Primary Examiner* — Chandrika Prasad
(74) *Attorney, Agent, or Firm* — Buchanan Ingersoll & Rooney PC

(57) ABSTRACT

A plug-in unit assembly is disclosed which includes a case and a plug-in unit arranged to be removably connected to the case. The plug-in unit includes a unit body, a handle and an actuating member. The handle is pivotally connected to the unit body and operationally connected to the actuating member, the actuating member being movably connected to the unit body. The case includes a locking counterpart element and a releasing counterpart element, each of which is adapted to co-operate with the actuating member for moving the plug-in unit. The locking counterpart element is adapted to move the plug-in unit to a plugged-in position, and the releasing counterpart element is adapted to move the plug-in unit to an outer releasing position.

15 Claims, 5 Drawing Sheets

PLUG-IN-UNIT ASSEMBLY WITH AN OFF-CENTER PIVOTAL CONNECTION BETWEEN A HANDLE AND AN ACTUATING MEMBER

RELATED APPLICATION

This application claims priority under 35 U.S.C. §119 to European Patent Application No. 10163244.6 filed in Europe on May 19, 2010, the entire content of which is hereby incorporated by reference in its entirety.

FIELD

The disclosure relates to a plug-in unit assembly including a case and a plug-in unit arranged to be removably connected to the case.

BACKGROUND INFORMATION

An example of a known plug-in unit assembly is described in U.S. Pat. No. 7,175,470, which discloses a plug-in unit assembly having a handle. By turning the handle a plug-in unit may be pushed slightly outwards from a case. Such an arrangement enables a reduction in the force used to detach the plug-in unit from the case. Examples of other known plug-in unit assemblies are described in U.S. Patent Application Publication No. 2009/080165 A1, U.S. Pat. No. 6,222,736 B1 and U.S. Pat. No. 6,137,684.

In a plug-in unit assembly having a plurality of electrical connectors adapted to be coupled when the plug-in unit is connected to the case, it can be desirable to reduce the force involved in connecting the plug-in unit to the case. This is desirable when the plurality of electrical connectors includes electrical connectors having high rated currents. A connecting force of an electrical connector can correlate with a rated current of the electrical connector, for example, the higher the rated current, the greater the required connecting force. U.S. Pat. No. 7,175,470 does not discuss the matter of reducing the force to connect the plug-in unit to the case.

SUMMARY

A plug-in unit assembly is disclosed which has a case, and a plug-in unit arranged to be removably connected to the case, the plug-in unit having a plugged-in position and a detached position in relation to the case the plug-in unit. The unit body, a handle, and an actuating member, the handle being pivotally connected to the unit body for pivoting between a normal position and a mounting position in relation to the unit body, the actuating member being movably connected to the unit body for movement between a locking position and a releasing position in relation to the unit body, the handle being operationally connected to the actuating member such that a pivoting of the handle from the mounting position to the normal position will move the actuating member from the releasing position to the locking position and a pivoting of the handle from the normal position to the mounting position will move the actuating member from the locking position to the releasing position; the case comprising a locking counterpart element; and a releasing counterpart element, the locking counterpart element co-operating with the actuating member for moving the plug-in unit from an outer plugging position to the plugged-in position in response to a movement of the actuating member from the releasing position to the locking position, the outer plugging position being located at a predetermined plugging distance from the plugged-in position towards the detached position, and the releasing counterpart element being configured for co-operating with the actuating member for moving the plug-in unit from the plugged-in position to an outer releasing position in relation to the case in response to a movement of the actuating member from the locking position to the releasing position, the outer releasing position being located at a predetermined release distance from the plugged-in position towards the detached position, wherein the actuating member is pivotally connected to the handle through an off-center pivotal connection, the off-center pivotal connection being located at a distance from a pivoting axis of the handle and allowing the actuating member to pivot in relation to the handle, the actuating member is connected to the unit body through a guiding slot connection, the guiding slot connection including a guiding slot provided on one of the actuating member and the unit body, the guiding slot connection being configured for slidingly guiding the movement of the actuating member between the locking position and the releasing position, and the actuating member includes a locking surface for co-operating with the locking counterpart element and a releasing surface arranged to co-operate with the releasing counterpart element, both the locking surface and the releasing surface being located at a distance from the off-center pivotal connection.

A plug-in unit is disclosed for removable connection to a case, the plug-in unit having a plugged-in position and a detached position in relation to the case. The plug-in unit comprising a unit body, a handle, and an actuating member, the handle being pivotally connected to the unit body for pivoting between a normal position and a mounting position in relation to the unit body, the actuating member being movably connected to the unit body for movement between a locking position and a releasing position in relation to the unit body, the handle being operationally connected to the actuating member such that a pivoting of the handle from the mounting position to the normal position will move the actuating member from the releasing position to the locking position and a pivoting of the handle from the normal position to the mounting position will move the actuating member from the locking position to the releasing position, wherein the actuating member is pivotally connected to the handle through an off-center pivotal connection, the off-center pivotal connection being located at a distance from a pivoting axis of the handle and allowing the actuating member to pivot in relation to the handle, the actuating member is connected to the unit body through a guiding slot connection, the guiding slot connection including a guiding slot provided on one of the actuating member and the unit body, the guiding slot connection being configured for slidingly guiding the movement of the actuating member between the locking position and the releasing position, and the actuating member includes a locking surface for co-operating with a locking counterpart element of a case, and a releasing surface arranged to co-operate with a releasing counterpart element of a case, both the locking surface and the releasing surface being located at a distance from the off-center pivotal connection.

A case for connection with a moveable plug-in unit is disclosed. The case comprising a locking counterpart element, and a releasing counterpart element, the locking counterpart element being configured for co-operating with an actuating member of a plug-in unit for moving the plug-in unit from an outer plugging position to a plugged-in position in response to a movement of the actuating member from a releasing position to a locking position, the outer plugging position being located at a predetermined plugging distance from the plugged-in position towards a detached position of a plug-in unit, and the releasing counterpart element for co-operating with the actuating member for moving a plug-in unit from the plugged-in position to an outer releasing position in relation to the case in response to a movement of the actuating member from the locking position to the releasing position, the outer releasing position being located at a predetermined release distance from the plugged-in position towards the detached position, wherein the actuating member of the plug-in unit pivotally connect to the handle through an off-center pivotal connection, the off-center pivotal connection being located at a distance from a pivoting axis of the handle and allowing the actuating member to pivot in relation to the handle, and the actuating member includes a locking surface for co-operating with the locking counterpart element, and a releasing surface arranged to co-operate with the releasing counterpart element, both the locking surface and the releasing surface being located at a distance from the off-center pivotal connection.

BRIEF DESCRIPTION OF THE DRAWINGS

In the following, exemplary embodiments of the disclosure will be described in closer detail with reference to the accompanying drawings, in which.

DETAILED DESCRIPTION

The disclosure relates to a plug-in unit assembly which can reduce the force involved to connect a plug-in unit to a case.

A plug-in unit is disclosed with an actuating member which can be moved between a locking position and a releasing position by turning a handle of the plug-in unit. The actuating member is arranged to co-operate with the case for moving the plug-in unit to a plugged-in position in response to movement of the actuating member from the releasing position to the locking position.

An exemplary plug-in unit assembly according to the disclosure can enable a reduction in the force required to connect a plug-in unit to a case.

Figure 1:
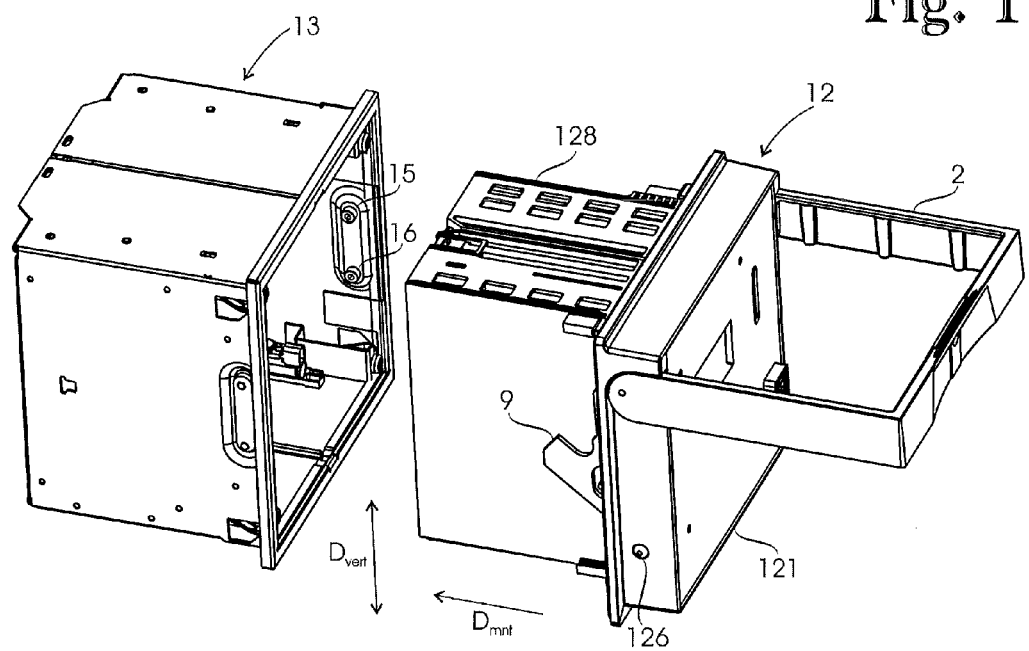
FIG. 1 shows a plug-in unit assembly according to an exemplary embodiment of the disclosure, the plug-in unit of the assembly being in a detached position.
Figure 2:
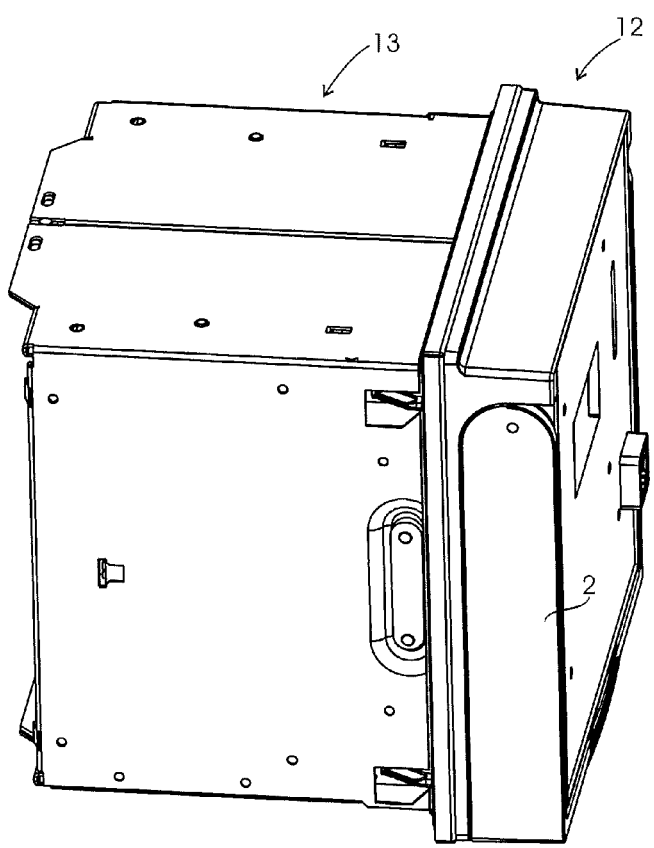
FIG. 2 shows the plug-in unit assembly of FIG. 1, the plug-in unit being in a plugged-in position.

FIG. 1 shows an exemplary embodiment of a plug-in unit assembly including a case 13 and a plug-in unit 12 arranged to be removably connected to the case 13. The plug-in unit 12 has a plugged-in position and a detached position in relation to the case 13. In FIG. 1, the plug-in unit 12 is in the detached position, wherein the plug-in unit 12 is completely detached from the case 13. The plugged-in position is shown in FIG. 2.

The plug-in unit 12 includes a unit body 121, a unit housing 128, a handle 2 and an actuating member 9. The unit housing 128 can be immovably connected to the unit body 121 and is adapted to be received inside the case 13 when the plug-in unit 12 is in the plugged-in position. The handle 2 is pivotally connected to the unit body 121 for pivoting between a normal position and a mounting position in relation to the unit body 121. The actuating member 9 is movably connected to the unit body 121 for movement between a locking position and a releasing position in relation to the unit body 121. In FIG. 1, the handle 2 is in the mounting position and the actuating member 9 is in the releasing position. The normal position of the handle is shown in FIG. 2.

The handle 2 is operationally connected to the actuating member 9 such that pivoting the handle 2 from the mounting position to the normal position moves the actuating member 9 from the releasing position to the locking position. Correspondingly, pivoting the handle 2 from the normal position to the mounting position moves the actuating member 9 from the locking position to the releasing position.

The case 13 includes a locking counterpart element 15 and a releasing counterpart element 16. The locking counterpart element 15 and the releasing counterpart element 16 are spaced apart and located on a vertical line. The vertical line can be substantially parallel with a vertical direction Dvert which can be substantially perpendicular in relation to both the pivoting axis of the handle 2 and a mounting direction Dmnt. The mounting direction Dmnt can be a direction in which the plug-in unit 12 is adapted to be pushed when connecting the plug-in unit 12 to the case 13. Both the locking counterpart element 15 and the releasing counterpart element 16 can be formed by heads of corresponding hexagonal socket-head screws screwed from inside the unit body 121. A peripheral surface of the head of each of the hexagonal socket-head screws is a symmetrical and cylindrical surface having a symmetry axis parallel with the pivoting axis of the handle 2.

In an exemplary embodiment, both the locking counterpart element and the releasing counterpart element can be formed by portions of shanks of screws. The portions of shanks may or may not include threading. In this exemplary embodiment, the screws can be screwed from outside the unit body.

Figure 3:
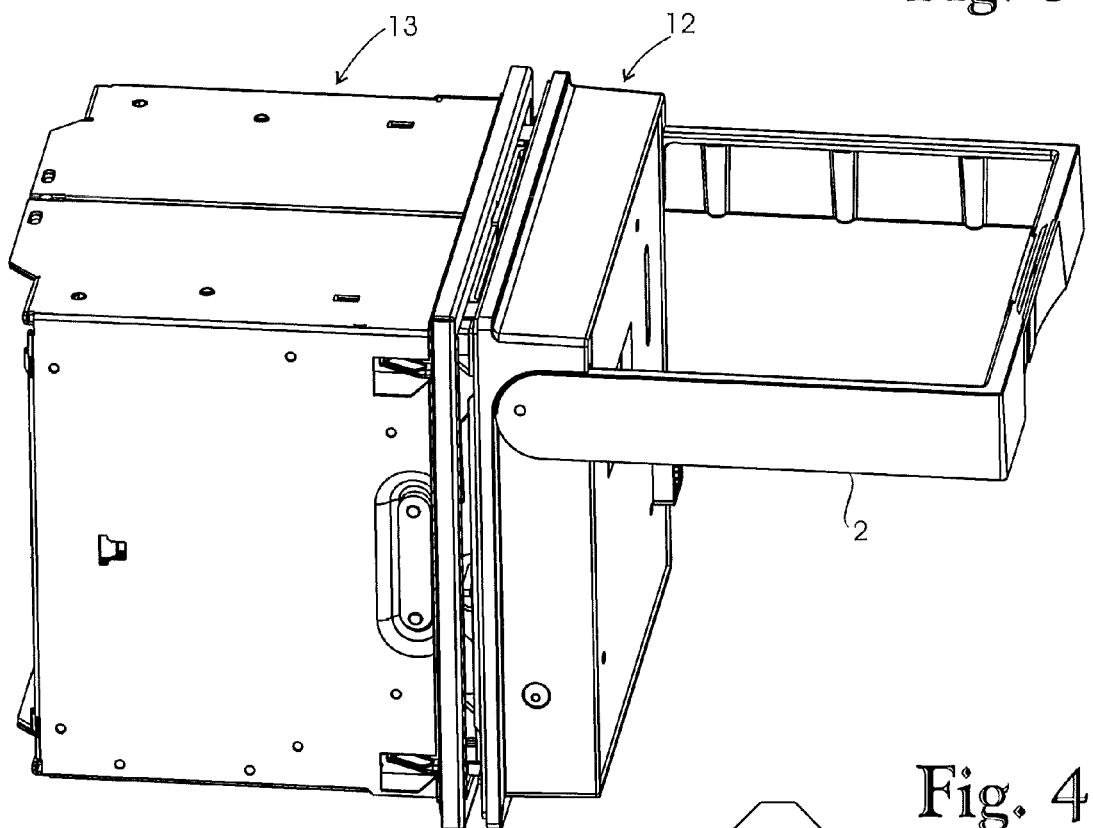
FIG. 3 shows the plug-in unit assembly of FIG. 1, the plug-in unit being in an outer plugging position.

The locking counterpart element 15 can be adapted (i.e., configured) to co-operate with the actuating member 9 for moving the plug-in unit 12 from an outer plugging position to the plugged-in position in response to movement of the actuating member 9 from the releasing position to the locking position. The outer plugging position can be located at a predetermined plugging distance from the plugged-in position towards the detached position. The outer plugging position of the plug-in unit 12 is shown in FIG. 3. Further, the locking counterpart element 15 is adapted (i.e., configured) to co-operate with the actuating member 9, while the actuating member 9 is in the locking position, in order to prevent movement of the plug-in unit 12 from the plugged-in position towards the detached position.

In an exemplary embodiment, the plug-in unit can include at least one electrical component having an electrical connector arranged to be coupled to a corresponding mating connector installed in the case when the plug-in unit is being attached to its case. In this embodiment, the outer plugging position can be located such that substantially the entire coupling event (e.g., the coupling of the electrical connector to the mating connector) takes place between the outer plugging position and the plugged-in position. This can reduce the force required to connect the plug-in unit to the case.

The releasing counterpart element 16 is adapted to co-operate with the actuating member 9 for moving the plug-in unit 12 from the plugged-in position to an outer releasing position in relation to the case 13 in response to movement of the actuating member 9 from the locking position to the releasing position. The outer releasing position can be located at a predetermined release distance from the plugged-in position towards the detached position. In the exemplary embodiment, the outer releasing position is equal to the outer plugging position shown in FIG. 3. In an exemplary embodiment, there can be a distance between the outer plugging position and the outer releasing position.

The locking counterpart element 15 can be located in the upper half of the case 13. The releasing counterpart element 16 can be located in the lower half of the case 13. The distance between the locking counterpart element 15 and the upper surface of the case 13 can be identical to the distance between the releasing counterpart element 16 and the lower surface of the case 13.

Figure 4:
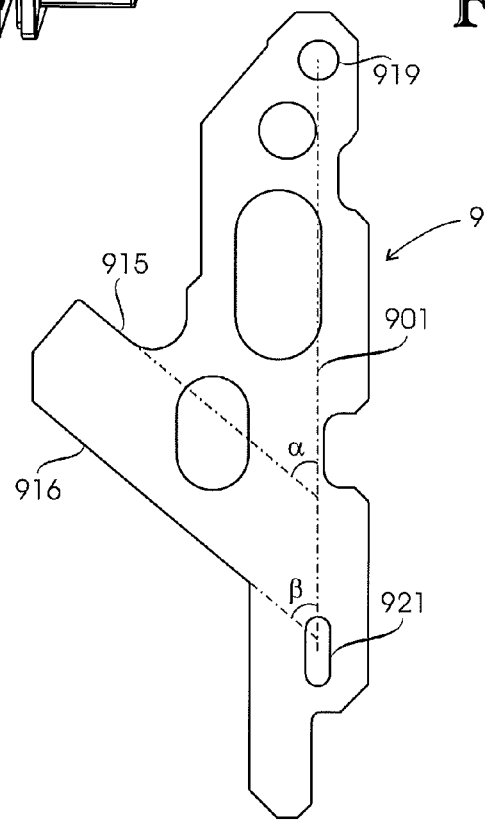
FIG. 4 shows a side view of an exemplary embodiment of an actuating member.

FIG. 4 shows a side view of the actuating member 9. A circular connecting aperture 919 can be provided on the upper end of the actuating member 9. A linearly extending guiding slot 921 can be provided on the lower end of the actuating member 9. The actuating member 9 can also include a locking surface 915 arranged to co-operate with the locking counterpart element 15, and a releasing surface 916 arranged to co-operate with the releasing counterpart element 16. Both the locking surface 915 and the releasing surface 916 can extend substantially perpendicularly in relation to the image plane of FIG. 4 and can be narrow, planar surfaces. In exemplary embodiments the locking surface and/or the releasing surface may be a curved surface.

The locking surface 915 forms an angle α in relation to an actuating member center line 901 which extends between a center point of the connecting aperture 919 and a center point of the guiding slot 921. The releasing surface 916 forms an angle β in relation to the actuating member center line 901. In the exemplary embodiment of FIG. 4, both the angle α and the angle β are approximately (e.g., ±10%) 50°. In exemplary embodiments, the angles α and β may be in a range of, for example, 30° to 70°.

In exemplary embodiments where the locking surface and/or the releasing surface is a curved surface, a tangent of each curved surface can vary in some subrange of above mentioned range of 30° to 70°. For example, if a releasing surface is a curved surface, the tangent of the curved releasing surface may in one point extend in a substantially (e.g., ±10%) 35° angle in relation to the actuating member center line while the tangent in another point extends in a substantially 65° angle in relation to the actuating member center line. Curvature of a locking surface can be selected such that a torque required (e.g., specified) for turning the handle from the mounting position to the normal position can be substantially constant during the turning of the handle. Similarly, the curvature of the releasing surface can be selected such that a torque required for turning the handle from the normal position to the mounting position is substantially constant during the turning of the handle.

Figure 5:
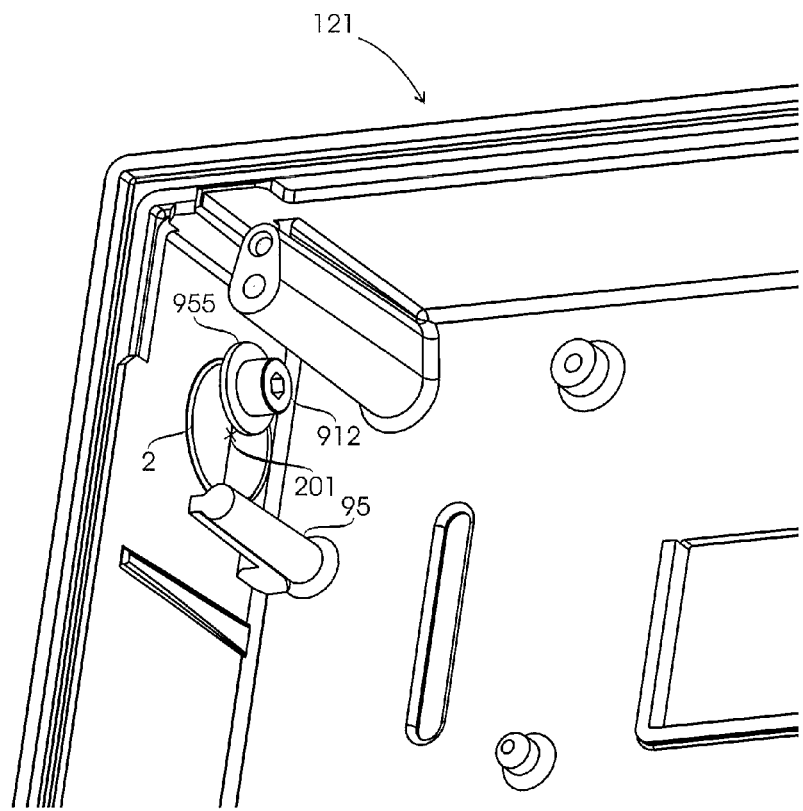
FIG. 5 shows an upper corner of an interior of a unit body of an exemplary embodiment of a plug-in unit.

FIG. 5 shows an upper corner of the interior of the unit body 121. A pivotal shaft 912 can be formed on the handle 2. The pivotal shaft 912 has a free end adapted to be received in the connecting aperture 919 of the actuating member 9. The pivotal shaft 912 can be located at a distance from a pivoting axis of the handle 2 and can allow the actuating member 9 to pivot in relation to the handle 2. A point through which the pivoting axis of the handle 2 passes is denoted with reference numeral 201. The pivotal shaft 912 can be formed by a head of a hexagonal socket-head screw. The screw is screwed into the handle 2. Under the head of the screw a washer 955 can be provided which can prevent release of the handle 2 from the unit body 121.

In an exemplary embodiment, the pivotal shaft can be formed by a portion of a shank of a screw. The screw can be screwed into the handle from outside the unit body. In an exemplary embodiment, a screw can be screwed into the actuating member and a portion of the screw forms the pivotal shaft. In an exemplary embodiment, the connecting aperture can be provided on the handle.

Figure 6:
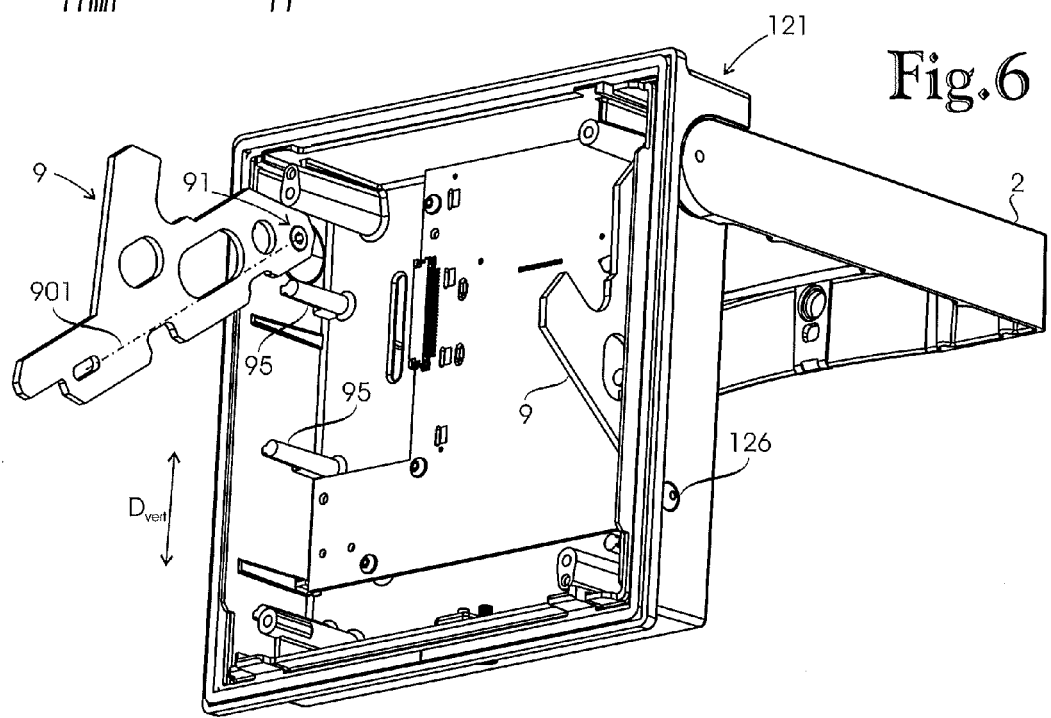
FIGS. 6 and 7 illustrate mounting of an exemplary embodiment of an actuating member into the exemplary plug-in unit.
Figure 7:
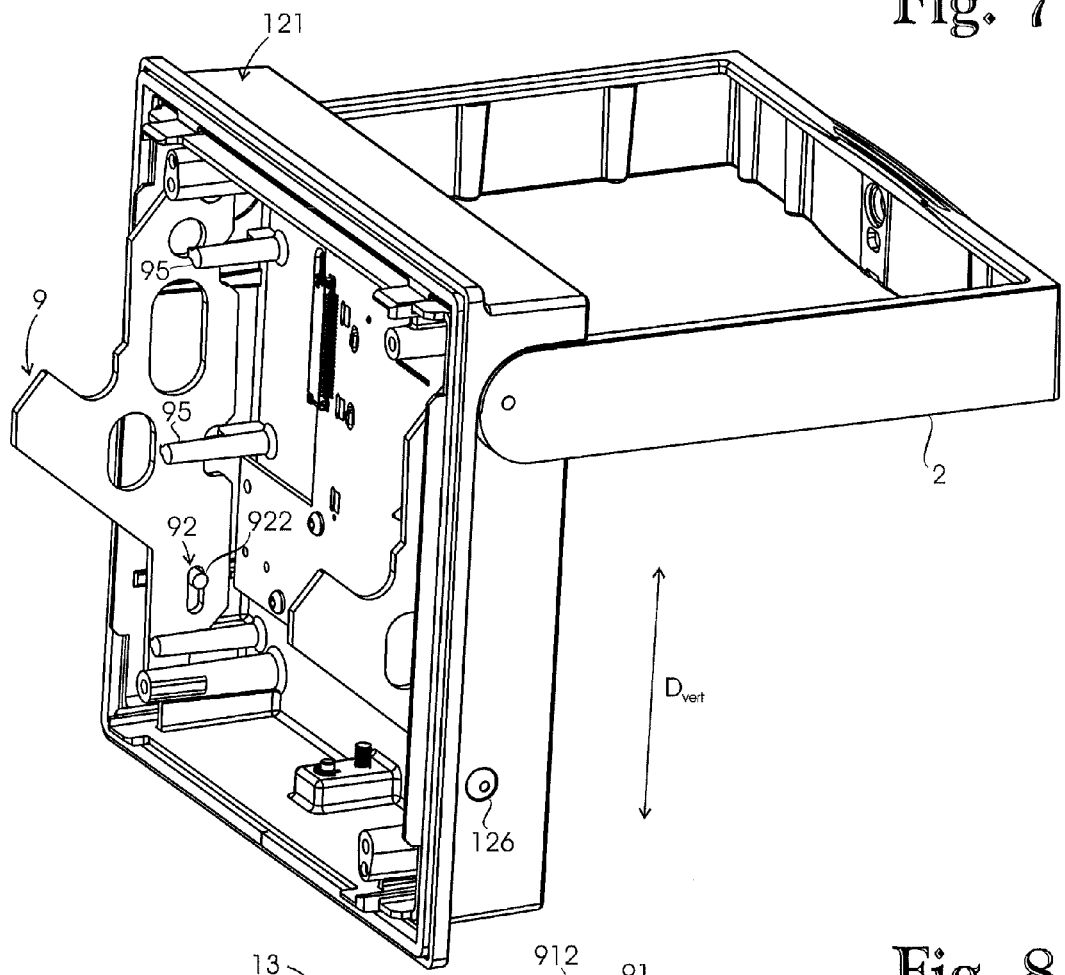

FIGS. 6 and 7 illustrate exemplary mounting of the actuating member 9 into the plug-in unit 12. In FIGS. 6 and 7, no unit housing 128 is shown. In FIG. 6, the pivotal shaft 912 has been fitted in the connecting aperture 919 of the actuating member 9 in order to provide an off-center pivotal connection 91. The off-center pivotal connection 91 can be located at a distance from the pivoting axis of the handle 2 and can allow the actuating member 9 to pivot in relation to the handle 2. In FIG. 6, the actuating member 9 is in a position where the actuating member center line 901 extends at an angle which is, for example, greater than 45° in relation to the vertical direction Dvert. This position of the actuating member 9 enables the pivotal shaft 912 to be fitted into the connecting aperture 919.

After the pivotal shaft 912 has been fitted in the connecting aperture 919, the actuating member 9 can be pivoted around the pivotal shaft 912 into a position where the actuating member center line 901 extends substantially parallel with the vertical direction Dvert as depicted in FIG. 7. A support screw 126 can be screwed into the guiding slot 921 in order to provide a guiding slot connection 92. The support screw 126 has a free end which forms a slot pin 922 adapted to co-operate with the guiding slot 921 by sliding in the guiding slot 921. The support screw 126 can be screwed from outside the unit body 121.

FIG. 7 shows that a lateral movement of the actuating member 9 can be prevented when the actuating member center line 901 extends substantially parallel with the vertical direction Dvert. Herein, the lateral movement of the actuating member 9 is substantially parallel with the pivoting axis of the handle 2. On one side, the lateral movement of the actuating member 9 can be prevented by an inner side surface of the unit body 121, and on the other side the lateral movement of the actuating member 9 can be prevented by guide pins 95.

In an exemplary embodiment the guiding slot connection can include a guiding slot provided on the unit body. The guiding slot can be adapted (e.g., configured) to receive a portion of the actuating member and to slidingly guide movement of the actuating member between the locking position and the releasing position. It can be interpreted that in above mentioned embodiment the portion of the actuating member can act as a slot pin.

Figure 8:
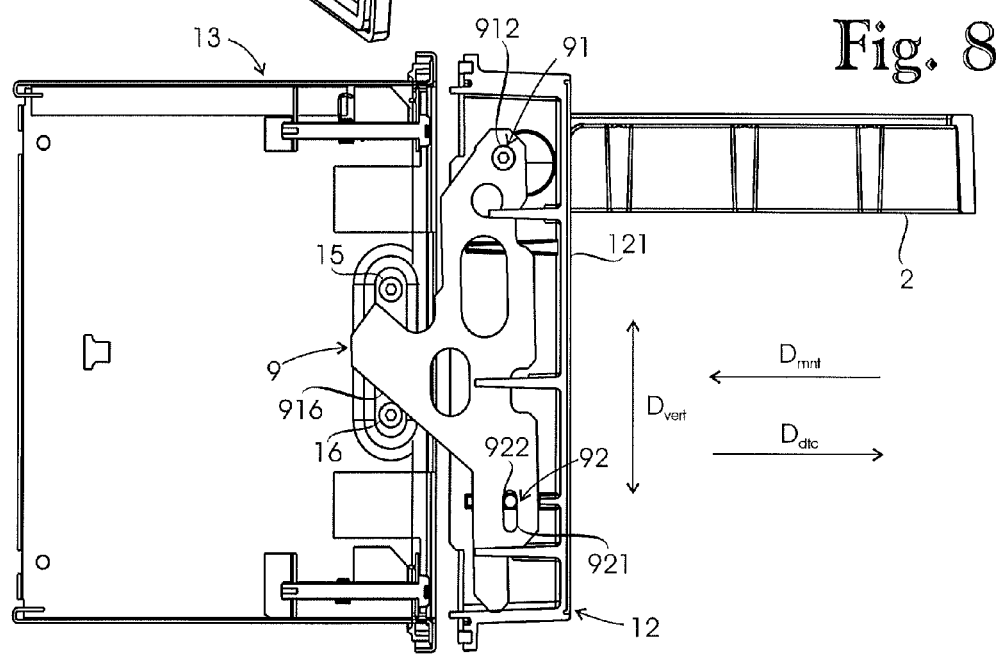
FIG. 8 is a sectional view showing the plug-in unit assembly of FIG. 1, the plug-in unit being in the outer plugging position.
Figure 9:
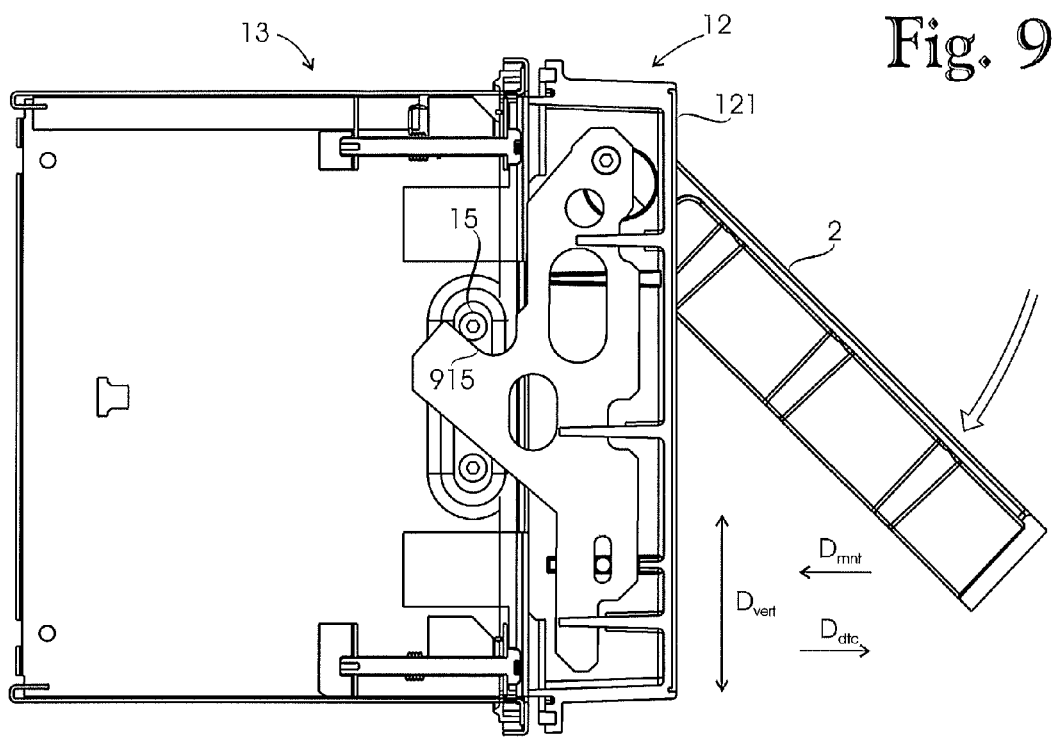
FIG. 9 shows the plug-in unit assembly of FIG. 8, the plug-in unit being in an intermediate position.
Figure 10:
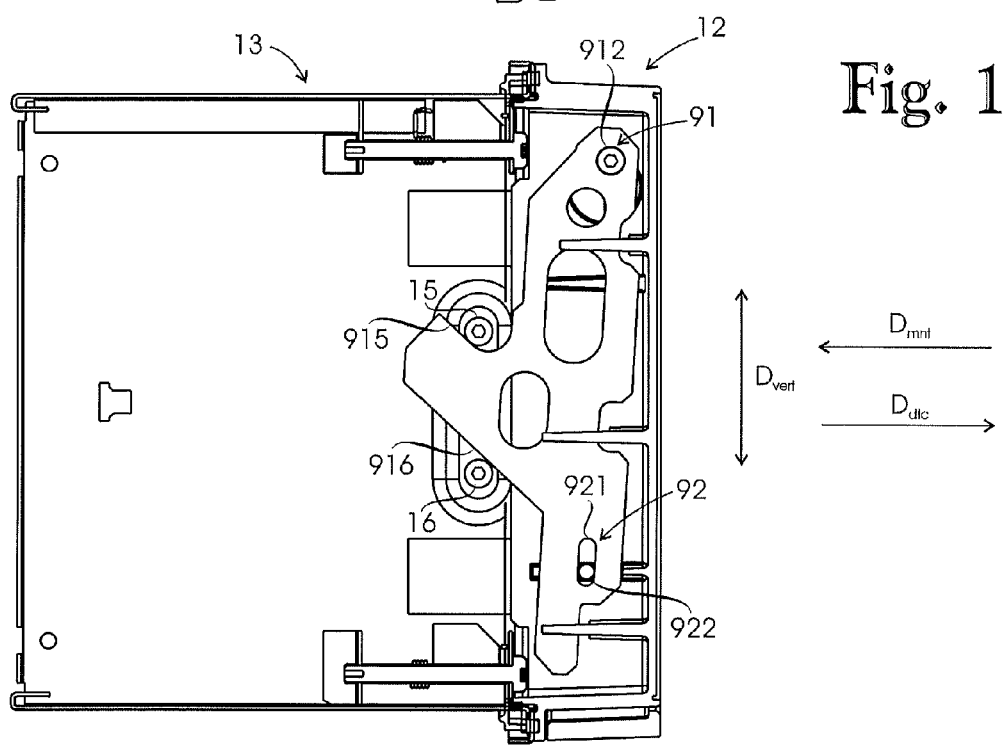
FIG. 10 shows the plug-in unit assembly of FIG. 8, the plug-in unit being in the plugged-in position.

FIGS. 8 to 10 show a sectional view of the plug-in unit assembly, illustrating the operation of the actuating member 9. As discussed above, the upper part of the actuating member 9 can be pivotally connected to the handle 2 through the off-center pivotal connection 91 which can allow the actuating member 9 to pivot in relation to the handle 2. The lower part of the actuating member 9 can be connected to the unit body 121 through the guiding slot connection 92 as explained above.

In FIG. 8, the handle 2 is in the mounting position, the actuating member 9 is in the releasing position, and the plug-in unit 12 is in the outer plugging position. The releasing surface 916 of the actuating member 9 is in contact with the releasing counterpart element 16. The locking surface 915 is at a distance from the locking counterpart element 15.

In FIG. 10, the handle 2 is in the normal position, the actuating member 9 is in the locking position, and the plug-in unit 12 is in the plugged-in position. The locking surface 915 of the actuating member 9 is in contact with the locking counterpart element 15. The releasing surface 916 is at a distance from the releasing counterpart element 16.

The movement of the plug-in unit 12 from the outer plugging position of FIG. 8 to the plugged-in position of FIG. 10 can be achieved by turning the handle 2 from the mounting position to the normal position. The turning of the handle 2 moves the actuating member 9 from the releasing position to the locking position owing to the off-center pivotal connection 91 which moves the pivotal shaft 912 upwards and in a detaching direction Ddtc in relation to the unit body 121. Herein, the upwards direction can be a direction parallel to the vertical direction Dvert and directed away from the slot pin 922. The detaching direction Ddtc can be a direction opposite to the mounting direction Dmnt.

FIG. 9 illustrates an exemplary intermediate state between the states illustrated in FIGS. 8 and 10. In the intermediate state, the locking surface 915 co-operates with the locking counterpart element 15 transferring forces that move the plug-in unit 12 towards the plugged-in position.

FIGS. 8 to 10 show that the handle 2 provides a long lever arm, almost as long as the height of the front surface of the unit body 121. This can be made possible, by, for example, locating the pivoting axis of the handle 2 near the upper surface of the unit body 121. The long lever arm of the handle 2 can reduce the force used to operate the handle 2.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A plug-in unit assembly, comprising:
   a case; and
   a plug-in unit arranged to be removably connected to the case, the plug-in unit having a plugged-in position and a detached position in relation to the case, the plug-in unit comprising:
      a unit body;
      a handle; and
      an actuating member, the handle being pivotally connected to the unit body for pivoting between a normal position and a mounting position in relation to the unit body, the actuating member being movably connected to the unit body for movement between a locking position and a releasing position in relation to the unit body, the handle being operationally connected to the actuating member such that a pivoting of the handle from the mounting position to the normal position will move the actuating member from the releasing position to the locking position and a pivoting of the handle from the normal position to the mounting position will move the actuating member from the locking position to the releasing position;
   the case comprising:
      a locking counterpart element; and
      a releasing counterpart element, the locking counterpart element co-operating with the actuating member for moving the plug-in unit from an outer plugging position to the plugged-in position in response to a movement of the actuating member from the releasing position to the locking position, the outer plugging position being located at a predetermined plugging distance from the plugged-in position towards the detached position, and the releasing counterpart element being configured for co-operating with the actuating member for moving the plug-in unit from the plugged-in position to an outer releasing position in relation to the case in response to a movement of the actuating member from the locking position to the releasing position, the outer releasing position being located at a predetermined release distance from the plugged-in position towards the detached position, wherein:
   the actuating member is pivotally connected to the handle through an off-center pivotal connection, the off-center pivotal connection being located at a distance from a pivoting axis of the handle and allowing the actuating member to pivot in relation to the handle,
   the actuating member is connected to the unit body through a guiding slot connection, the guiding slot connection including a guiding slot provided on one of the actuating member and the unit body, the guiding slot connection being configured for slidingly guiding the movement of the actuating member between the locking position and the releasing position, and
   the actuating member includes a locking surface for co-operating with the locking counterpart element and a releasing surface arranged to co-operate with the releasing counterpart element, both the locking surface and the releasing surface being located at a distance from the off-center pivotal connection.

2. A plug-in unit assembly as claimed in claim 1, wherein the off-center pivotal connection comprises:
   a pivotal shaft provided on one of the handle and the actuating member, the pivotal shaft having a free end; and
   a connecting aperture provided on the other of the handle and the actuating member, the connecting aperture for receiving the free end of the pivotal shaft for achieving the off-center pivotal connection.

3. A plug-in unit assembly as claimed in claim 2, wherein the pivotal shaft is provided on the handle, and the connecting aperture is provided on the actuating member.

4. A plug-in unit assembly as claimed in claim 1, wherein the guiding slot connection comprises:
   a slot pin provided on another of the actuating member and the unit body for co-operating with the guiding slot by sliding in the guiding slot.

5. A plug-in unit assembly as claimed in claim 4, wherein the guiding slot extends substantially linearly.

6. A plug-in unit assembly as claimed in claim 5, wherein the guiding slot is provided on the actuating member, and the slot pin is provided on the unit body.

7. A plug-in unit assembly as claimed in claim 1, wherein:
   the off-center pivotal connection comprises a pivotal shaft provided on the handle and a connecting aperture provided on the actuating member, the pivotal shaft having a free end and the connecting aperture being configured for receiving the free end of the pivotal shaft for achieving the off-center pivotal connection;
   the guiding slot extends substantially linearly and is provided on the actuating member, and the guiding slot connection includes a slot pin provided on the unit body for co-operating with the guiding slot by sliding in the guiding slot; and
   both the locking surface and the releasing surface are substantially planar surfaces, the locking surface forming an angle α in relation to an actuating member center line which extends between a center point of the connecting aperture and a center point of the guiding slot, the releasing surface forming an angle β in relation to the actuating member center line.

8. A plug-in unit assembly as claimed in claim 7, wherein both the angle α and the angle β are from 30° to 70°.

9. A plug-in unit assembly as claimed in claim 1, wherein the locking counterpart element comprises a peripheral surface for co-operating with the locking surface, and the releasing counterpart element comprises a peripheral surface for co-operating with the releasing surface, each of the peripheral surfaces being a substantially symmetrical and cylindrical surface having a symmetry axis substantially parallel with the pivoting axis of the handle.

10. A plug-in unit assembly as claimed in claim 9, wherein at least one of the pivotal shaft, the locking counterpart element and the releasing counterpart element is formed by a portion of a screw.

11. A plug-in unit assembly as claimed in claim 1, wherein the locking counterpart element and the releasing counterpart element are spaced apart and located on a substantially vertical line, the vertical line being parallel with a vertical direction substantially perpendicular in relation to both the pivoting axis of the handle and a mounting direction, the mounting direction being a direction in which the plug-in unit will be pushed when connecting the plug-in unit to the case.

12. A plug-in unit assembly as claimed in claim 2, wherein the off-center pivotal connection is located such that turning of the handle from the mounting position to the normal position moves the pivotal shaft upwards and in a detaching direction, the upwards direction being a direction substantially parallel to a substantially vertical direction and directed away from the guiding slot connection, the detaching direction being a direction opposite to a mounting direction, the vertical direction being substantially perpendicular in relation to both the pivoting axis of the handle and the mounting direction, the mounting direction being a direction in which the plug-in unit will be pushed when connecting the plug-in unit to the case.

13. A plug-in unit assembly as claimed in claim 1, wherein the actuating member, while in the locking position, co-operates with the locking counterpart element for preventing movement of the plug-in unit from the plugged-in position towards the detached position.

14. A plug-in unit for removable connection to a case, the plug-in unit having a plugged-in position and a detached position in relation to the case, the plug-in unit comprising:
 a unit body;
 a handle; and
 an actuating member, the handle being pivotally connected to the unit body for pivoting between a normal position and a mounting position in relation to the unit body, the actuating member being movably connected to the unit body for movement between a locking position and a releasing position in relation to the unit body, the handle being operationally connected to the actuating member such that a pivoting of the handle from the mounting position to the normal position will move the actuating member from the releasing position to the locking position and a pivoting of the handle from the normal position to the mounting position will move the actuating member from the locking position to the releasing position, wherein:
 the actuating member is pivotally connected to the handle through an off-center pivotal connection, the off-center pivotal connection being located at a distance from a pivoting axis of the handle and allowing the actuating member to pivot in relation to the handle,
 the actuating member is connected to the unit body through a guiding slot connection, the guiding slot connection including a guiding slot provided on one of the actuating member and the unit body, the guiding slot connection being configured for slidingly guiding the movement of the actuating member between the locking position and the releasing position, and
 the actuating member includes a locking surface for co-operating with a locking counterpart element of a case, and a releasing surface arranged to co-operate with a releasing counterpart element of a case, both the locking surface and the releasing surface being located at a distance from the off-center pivotal connection.

15. A case for connection with a moveable plug-in unit, the case comprising:
 a locking counterpart element; and
 a releasing counterpart element, the locking counterpart element being configured for co-operating with an actuating member of a plug-in unit for moving the plug-in unit from an outer plugging position to a plugged-in position in response to a movement of an the actuating member from a releasing position to a locking position, the outer plugging position being located at a predetermined plugging distance from the plugged-in position towards a detached position of a plug-in unit, and the releasing counterpart element for co-operating with the actuating member for moving a plug-in unit from the plugged-in position to an outer releasing position in relation to the case in response to a movement of the actuating member from the locking position to the releasing position, the outer releasing position being located at a predetermined release distance from the plugged-in position towards the detached position, wherein:
 the actuating member of the plug-in unit is pivotally connectable to a handle through an off-center pivotal connection, the off-center pivotal connection being located at a distance from a pivoting axis of the handle and allowing the actuating member to pivot in relation to the handle, and
 the actuating member includes a locking surface for co-operating with the locking counterpart element, and a releasing surface arranged to co-operate with the releasing counterpart element, both the locking surface and the releasing surface being located at a distance from the off-center pivotal connection.

* * * * *